(12) United States Patent
Baumgartner et al.

(10) Patent No.: US 8,171,437 B2
(45) Date of Patent: May 1, 2012

(54) AUTOMATED CONVERGENCE OF TERNARY SIMULATION BY SATURATION OF DEEP GATES

(75) Inventors: Jason R. Baumgartner, Austin, TX (US); Michael L. Case, Pflugerville, TX (US); Geert Janssen, Putnam Valley, NY (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 12/410,968

(22) Filed: Mar. 25, 2009

(65) Prior Publication Data

US 2010/0251199 A1   Sep. 30, 2010

(51) Int. Cl.
*G06F 9/45* (2006.01)
(52) U.S. Cl. ........ 716/103; 716/106; 716/107; 716/108; 716/111; 716/113
(58) Field of Classification Search .................. 716/103, 716/106, 107, 111, 136, 108, 113, 132, 135; 703/2, 14
See application file for complete search history.

(56) References Cited

U.S. PATENT DOCUMENTS

| | | | |
|---|---|---|---|
| 6,698,003 B2 | 2/2004 | Baumgartner et al. | |
| 6,944,838 B2 | 9/2005 | Mcmillan | |
| 7,310,790 B2 | 12/2007 | Melham et al. | |
| 7,315,996 B2 | 1/2008 | Baumgartner et al. | |
| 7,373,624 B2 | 5/2008 | Baumgartner et al. | |
| 7,596,770 B1 * | 9/2009 | Kuehlmann et al. | 716/106 |
| 2006/0155521 A1 | 7/2006 | Iwashita | |
| 2006/0236274 A1 | 10/2006 | Baumgartner et al. | |
| 2007/0299648 A1 * | 12/2007 | Levitt et al. | 703/22 |
| 2008/0134113 A1 | 6/2008 | Baumgartner et al. | |

OTHER PUBLICATIONS

Per Bjesse and James Kukula, Automatic Generalized Phase Abstraction for Formal Verification, Proceedings of the 2005 International Conference on Computer Aided Design, Nov. 6-10, 2005, DoubleTree Hotel, San Jose, Ca, IEEE 2005.

* cited by examiner

*Primary Examiner* — Paul Dinh
*Assistant Examiner* — Nha Nguyen
(74) *Attorney, Agent, or Firm* — Yudell Isidore Ng Russell PLLC

(57) ABSTRACT

A method, system and computer program product for X-Saturated ternary simulation based reduction. An X-Saturated ternary simulation (XSTS) utility, which executes on a computer system, receives design information, where the design information includes a netlist. The XSTS utility initializes one or more data structures and/or variables and simulates, in a ternary fashion, the netlist at a time value by applying logical X values to all RANDOM gates of the netlist and to registers marked X_SATURATED. For each register of the netlist XSTS utility: determines whether or not the register departs from its expected prefix behavior, and if the register departs from its expected prefix behavior, the register is marked as X_SATURATED and the current state is updated with an X value upon the register. XSTS utility can store the current state in a data structure and can use the information from the data structure to simplify the design.

19 Claims, 12 Drawing Sheets

AUTOMATED CONVERGENCE OF TERNARY SIMULATION BY SATURATION OF DEEP GATES

BACKGROUND

1. Technical Field

The present invention generally relates to verification of optimized designs. More specifically, the present invention relates to design size reduction using ternary simulation.

2. Description of the Related Art

Many applications can benefit by reducing the size of a design representation while preserving functionality. For example, synthesis often includes an explicit objective to reduce design size and can benefit verification, since verification can often be more efficient on a reduced or smaller design. However, most techniques for design reduction tend to be rather computationally expensive, particularly those that require sequential analysis.

Ternary simulation is a technique that analyzes behavior of a design under "0", "1", "X" valuations to the gates of the design (where "X" is a "do not care" or undetermined value representing either "0" or "1"). By assigning values of "X" to the valuations of primary inputs and by simulating the design until a state vector is repeated, identification of gates that are constant or pairs of gates that are equivalent can be determined. Simplification of the design can be accomplished by simplifying the gates of the resulting ternary sequence accordingly. However, there is at least one fundamental weakness of ternary simulation-based reduction: it may not converge with reasonable resources on temporally "deep" designs. For instance, a design with a 64-bit counter can require $2^{64}$ (i.e., 2 to the power of 64) time frames or iterations of a simulation before convergence is possible. This can be too computationally expensive to perform. Accordingly, there is a need for a method, a system and/or a computer program product for convergence (repetition) of ternary simulation by saturating "deep" gates to a ternary "X" and an optimization of resulting reductions under a fixed number of ternary simulation steps.

SUMMARY OF ILLUSTRATIVE EMBODIMENTS

Disclosed are a method, a system and a computer program product for X-Saturated ternary simulation based reduction. A X-Saturated ternary simulation (XSTS) utility, which executes on a computer system, receives design information, where the design information includes a netlist and where the XSTS utility receives the design information from one or more of a user, a memory medium (e.g., random access memory, non-volatile memory, network accessible memory, etc.), and/or a network (e.g., a local area network, a wide area network, a public network such as an Internet, etc.). After receiving the design information, the XSTS utility initializes a hash table, sets a converged value to zero, sets a time value to an initial value (e.g., a value of zero). XSTS utility sets a current state and simulates, in a ternary fashion, the netlist at the time value by applying logical X values to all RANDOM gates (e.g., primary inputs) of the netlist and to registers marked X_SATURATED of all registers of the netlist.

For each register (or latch) of the netlist, XSTS utility determines whether or not the register is not already marked as X_SATURATED and the register is found to depart from its expected prefix behavior. If the register is not already marked as X_SATURATED and the register is found to depart from its expected prefix behavior, XSTS utility marks the register as X_SATURATED and updates the current state with an X value upon the register. XSTS utility searches the hash table for the current state and determines whether or not the current state was found in the hash table. If the current state was found in the hash table, XSTS utility sets the converged value to one. If the current state was not found in the hash table, XSTS utility inserts the current state into the hash table. XSTS utility determines whether or not one or more resources are exceeded. If the one or more resources are not exceeded, XSTS utility increments the time value by one and repeats from setting the current state. If the one or more resources are exceeded, XSTS utility determines whether or not the converged value is not zero. If the converged value is zero, XSTS utility indicates that the design could not be simplified. XSTS utility can indicate that the design could not be simplified by outputting a message to a user, storing a message in a memory medium (e.g., random access memory, non-volatile memory, network accessible memory, etc.), and/or sending a message to a network (e.g., a local area network, a wide area network, a public network such as an Internet, etc.). If the converged value is not zero, XSTS utility simplifies the design using information from the hash table and outputs the simplified design. XSTS utility can output the simplified design by outputting the simplified design to a display, storing the simplified design in a memory medium (e.g., random access memory, non-volatile memory, network accessible memory, etc.), and/or sending the simplified design to a network (e.g., a local area network, a wide area network, a public network such as an Internet, etc.).

The above as well as additional objectives, features, and advantages of the present invention will become apparent in the following detailed written description.

BRIEF DESCRIPTION OF THE DRAWINGS

The invention itself, as well as advantages thereof, will best be understood by reference to the following detailed description of an illustrative embodiment when read in conjunction with the accompanying drawings, wherein.

DETAILED DESCRIPTION OF ILLUSTRATIVE EMBODIMENTS

Figure 1:
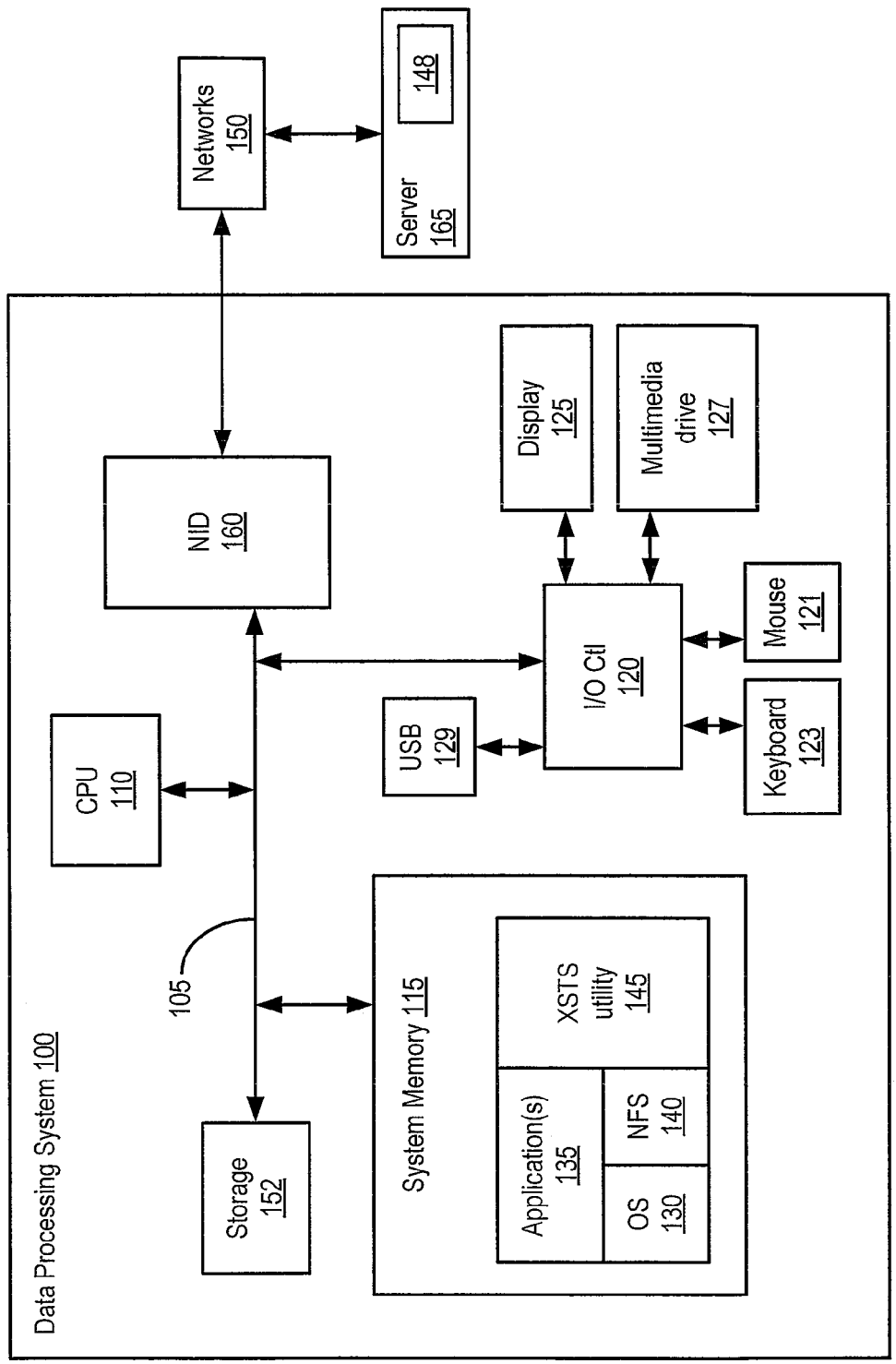
FIG. 1 provides a block diagram of a data processing system configured with hardware and software components for implementing one or more embodiments of the present invention.

The illustrative embodiments provide a method, system and computer program product for X-Saturated ternary simulation based reduction, where the X-Saturated ternary simulation based reduction simplifies at least a portion of an integrated circuit embodied by a netlist. An X-Saturated ternary simulation (XSTS) utility, which executes on a computer system, receives design information, where the design information includes a netlist and where the XSTS utility receives the design information from one or more of a user, a memory medium (e.g., random access memory, non-volatile memory, network accessible memory, etc.), and/or a network (e.g., a local area network, a wide area network, a public network such as an Internet, etc.).

After receiving the design information, the XSTS utility initializes a hash table, sets a converged value to zero, sets a time value to an initial value (e.g., a value of zero). XSTS utility sets a current state and simulates, in a ternary fashion, the netlist at the time value by applying logical X values to all RANDOM gates (e.g., primary inputs) of the netlist and to registers marked X_SATURATED of all registers of the netlist. For each register (or latch) of the netlist, XSTS utility determines whether or not the register is not already marked as X_SATURATED and the register is found to depart from its expected prefix behavior. If the register is not already marked as X_SATURATED and the register is found to depart from its expected prefix behavior, XSTS utility marks the register as X_SATURATED and updates the current state with an X value upon the register.

XSTS utility searches the hash table for the current state and determines whether or not the current state was found in the hash table. If the current state was found in the hash table, XSTS utility sets the converged value to one. If the current state was not found in the hash table, XSTS utility inserts the current state into the hash table. XSTS utility determines whether or not one or more resources are exceeded. If the one or more resources are not exceeded, XSTS utility increments the time value by one and repeats from setting the current state. If the one or more resources are exceeded, XSTS utility determines whether or not the converged value is not zero. If the converged value is zero, XSTS utility indicates that the design could not be simplified. For example, XSTS utility can indicate that the design could not be simplified by outputting a message to a user, storing a message in a memory medium (e.g., random access memory, non-volatile memory, network accessible memory, etc.), and/or sending a message to a network (e.g., a local area network, a wide area network, a public network such as an Internet, etc.). If the converged value is not zero, XSTS utility simplifies the design using information from the hash table and outputting the simplified design. For example, XSTS utility can output the simplified design by outputting the simplified design to a display, storing the simplified design in a memory medium (e.g., random access memory, non-volatile memory, network accessible memory, etc.), and/or sending the simplified design to a network (e.g., a local area network, a wide area network, a public network such as an Internet, etc.).

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional or otherwise) on the described embodiment.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized. Specifically, as utilized herein, the following terms are defined as follows: a "RANDOM gate" or "RANDOM" is a primary input (e.g., an input of the netlist that does not originate from a gate or register of the netlist); and a value of "X" is logical value representing a "don't care" value or a "not determined" value, where, X could be either a logical "0" or a logical "1" but not known or determined to be either. In one or more embodiments, a primary input is an input to the netlist.

With reference now to the figures, and beginning with FIG. 1, there is depicted a block diagram representation of an example data processing system (DPS) 100 as utilized within one embodiment. DPS 100 can be a computer, a portable device, such as a personal digital assistant (PDA), a smart phone, and/or other types of electronic devices that can generally be considered processing devices. As illustrated, DPS 100 includes at least one processor or central processing unit (CPU) 110 connected to system memory 115 via system interconnect/bus 105. Also connected to system bus 105 is input/output (I/O) controller 120, which provides connectivity and control for input devices, of which pointing device (or mouse) 121 and keyboard 123 are illustrated. I/O controller 120 also provides connectivity and control for output devices, of which display 125 is illustrated. Additionally, multimedia drive 127 (e.g., compact disk read/write (CDRW), digital video disk (DVD) drive, etc.) and USB (universal serial bus) port 129 are illustrated, coupled to I/O controller 120. Multimedia drive 127 and an USB port 129 enable insertion of a removable storage device (e.g., optical disk, "thumb" drive, etc.) on which data/instructions/code may be stored and/or from which data/instructions/code may be retrieved. DPS 100 also includes storage 152, within/from which data/instructions/code may also be stored/retrieved.

DPS 100 is also illustrated with network interface device (NID) 160, by which DPS 100 may connect to one or more networks, such as network 150. In one or more embodiments, network 150 may include and/or be coupled to another network, such as a wide area network (e.g., a wide area corporate network, the Internet, etc.), a local area network (LAN), a public switched telephone network (PSTN), or a virtual private network (VPN), among others. In one embodiment, the Internet represents/is a worldwide collection of networks and gateways that may utilize one or more protocols (e.g., Internet Protocol (IP), Transmission Control Protocol (TCP), User Datagram Protocol (UDP), Internet Control Message Protocol (ICMP), etc.). NID 160 may be configured to operate via wired and/or wireless connection to an access point of one or more networks. Connection to network 150 may be utilized to establish with one or more servers, such as server 165. In one embodiment, server 165 provides one or more of data, instructions, and code for execution on DPS 100.

In one or more embodiments, server 165 includes a software deploying server, and DPS 100 communicates with the software deploying server 165 via network 150 using network interface device 160. In one example, XSTS utility 148 (which may include various functionalities associated with XSTS utility 145) of server 165 may be deployed from/on network 150, via software deploying server 165. With this configuration, software-deploying server 165 performs all or almost all of the functions associated with the execution of XSTS utility 148. Accordingly, DPS 100 is not required to utilize internal computing resources of DPS 100 to execute XSTS utility 148. For example, XSTS utility 148 is executed on server 165, while user interactions (e.g., via keyboard, mouse, display, etc.) are conducted through DPS 100 and are communicated between server 165 and DPS 100 via network 150.

In one or more embodiments, XSTS utility 148 may be accessed through network 150 using network file system (NFS) 140, where CPU 110 executes instructions of XSTS utility 148 as they are received from software deploying server 165.

In addition to the above described hardware components of DPS 100, various features of the invention are completed/supported via software, firmware, code, and/or logic stored within memory 115 and/or other storage (e.g., storage 152) and executed by CPU 110. Thus, for example, illustrated within memory 115 are a number of software/firmware/logic components, including an operating system (OS) 130 (e.g., Microsoft Windows®, a trademark of Microsoft Corp, or GNU®/Linux®, registered trademarks of the Free Software Foundation and The Linux Mark Institute), one or more applications 135, and XSTS utility 145 which executes on CPU 110 to provide one or more reports of minterms of two or more timing points (positive and inverted) using logic from an existing optimized netlist by tracing the optimized netlist from timing point to timing point. In actual implementation, XSTS utility 145 may be combined with or incorporated within application(s) 135 to provide a single executable component, collectively providing the various functions of each individual software component when the corresponding combined code is executed by the CPU 110. For simplicity, XSTS utility 145 is illustrated and described as a stand alone or separate software/firmware component, which provides specific functions, as described below.

CPU 110 executes XSTS utility 145 as well as OS 130, which supports the user interface features of XSTS utility 145. In one embodiment, XSTS utility 145 generates/provides at least one graphical user interface (GUI) to enable user interaction with, or manipulation of, the functional features of XSTS utility 145. Certain functions supported and/or implemented by XSTS utility 145 generate processing logic executed by processor and/or device hardware to complete the implementation of that function. For simplicity of the description, the collective body of code that enables these various features is referred to herein as XSTS utility 145. The software code/instructions/logic provided by XSTS utility 145 include: (a) code/logic for receiving design information, where the design information includes the netlist; (b) code/logic for initializing a hash table; (c) code/logic for setting a converged value to zero; (d) code/logic for setting a time value to an initial value; (e) code/logic for setting a current state; (f) code/logic for simulating, in a ternary fashion, the netlist at the time value by applying logical X values to all RANDOM gates of the netlist and to registers marked X_SATURATED of all registers of the netlist; (g) code/logic for performing an iterative loop where for each register of the netlist, performing: determining whether or not the register is not already marked as X_SATURATED and the register is found to depart from its expected prefix behavior; and if the register is not already marked as X_SATURATED and the register is found to depart from its expected prefix behavior: marking the register as X_SATURATED; and updating the current state with an X value upon the register; (h) code/logic for searching for the current state in the hash table; (i) code/logic for determining whether or not the current state was found in the hash table; (j) code/logic for if the current state was found in the hash table, setting the converged value to one; and (k) code/logic for if the current state was not found in the hash table, inserting the current state into the hash table.

The software code/instruction/logic provide by XSTS utility 145 further include: (l) code/logic for determining whether or not one or more resources are exceeded; (m) code/logic for if the one or more resources are not exceeded: incrementing the time value by one; and performing the code/logic from (e); and (n) code/logic for if the one or more resources are exceeded: determining whether or not the converged value is not zero; if the converged value is zero, indicating that the design could not be simplified; and if the converged value is not zero: simplifying the design using information from the hash table; and outputting the simplified design. According to one or more embodiments, when CPU 110 executes XSTS utility 145, DPS 100 initiates a series of functional processes that enable the above functional features as well as additional features/functionality. These features/functionality are described in greater detail below within the description of FIGS. 2-5D.

Those of ordinary skill in the art will appreciate that the hardware components and basic configuration depicted in FIG. 1 can vary. The illustrative components within DPS 100 are not intended to be exhaustive, but rather are representative to highlight essential components that are utilized to implement the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, an IBM eServer pSeries system, a product of International Business Machines Corporation in Armonk, N.Y., running the Advanced interactive Executive (AIX) operating system or LINUX operating system.

Figure 2:
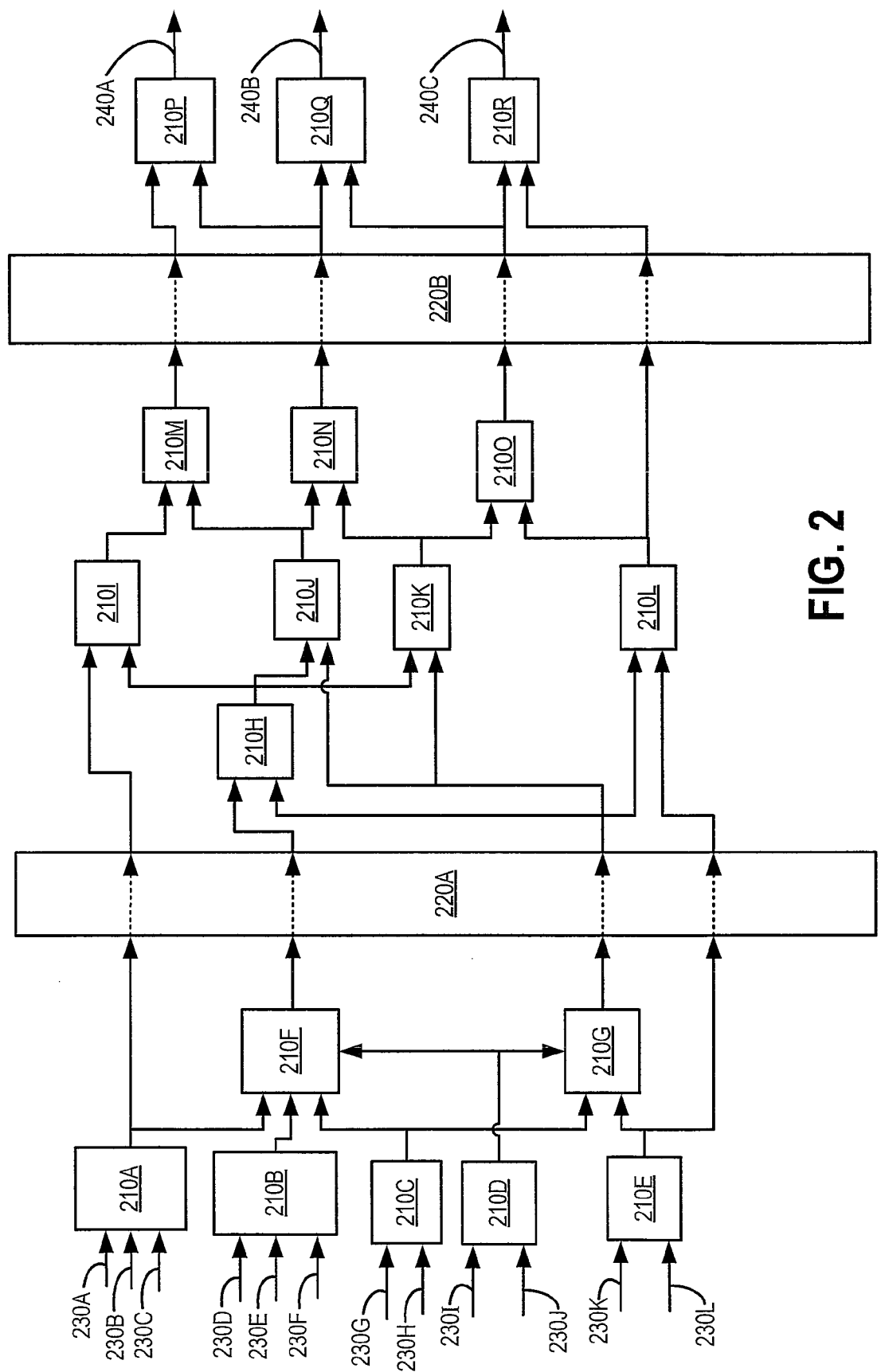
FIG. 2 illustrates an exemplary block diagram of an exemplary netlist.

With reference now to FIG. 2, a block diagram of an exemplary netlist is illustrated. In one or more embodiments, the netlist is represented by a directed graph with vertices representing gates (e.g., gates 210A-210R and registers 220A and 220B) and edges representing interconnections among the gates. The gates include associated functions. These associated functions can include constants, primary inputs (referred to as RANDOM gates), combinational logic (e.g., AND, OR, XOR, NAND, NOR, etc.), and sequential elements (referred to as registers or latches). The netlist receives information from inputs 230A-230L, and inputs 230A-230L are primary inputs, since they are inputs of the netlist that do not originate from a gate or register of the netlist.

As shown, gate 210A includes inputs 230A-230C, is coupled to a gate 210F, and is coupled gate 210I via register (or latch) 220A. Gate 210B includes inputs 230D-230F and is coupled to gate 210F. Gate 210C includes inputs 230G and 230H and is coupled to gates 210F and 210G. Gate 210D includes inputs 230I and 230J and is coupled to gates 210F and 210G. Gate 210E includes inputs 230K and 230L, is coupled to gate 210G, and is coupled to gate 210L via register 220A. Gate 210F is coupled to gate 210H via register 220A, and gate 210G is coupled to gates 210H and 210J-210L via register 220A. Gate 210H is coupled to gates 210I-210K. Gate 210I is coupled to gate 210M. Gate 210J is coupled to gates 210M and 210N. Gate 210K is coupled to gates 210N and 210O. Gate 210L is coupled to gate 210O and is coupled to gate 210R via register (or latch) 220B. Gate 210M is coupled to gate 210P via register 220B. Gate 210N is coupled to gates 210P and 210Q via register 220B. Gate 210O is coupled to gates 210Q and 210R via register 220B. Gates 210P-210R have respective outputs 240A-240C, as shown. In one or more embodiments, register 220A and/or register 220B can include one or more registers or latches. For example, register 220A can include four registers or latches to perform its functionality.

In one or more embodiments, each register includes two associated functions: its initial-value function and its next-state function. In one example, for each register: the value appearing at the register's initial-value at time "0" (e.g., "initialization", "reset time", "initial time", etc.) is applied as the value of the register; and the value appearing at the register's next-state function at time "i" is applied to the register at time "i+1". Often gates are analyzed using binary analysis where every gate will take a "0" or a "1" value over time.

In one or more embodiments, XSTS utility 145 utilizes ternary analysis where every gate will take a "0", a "1", or an "X" values over time. For example in a two-input AND gate, if either input of the AND gate evaluates to "0", the output of the AND gate must be "0" regardless of a value of the other input due to the logical properties of the gate. However, if none of the inputs of the gate evaluate to "0" and at least one of the inputs evaluates to "X", the output of the gate evaluates to "X".

Figure 3A:
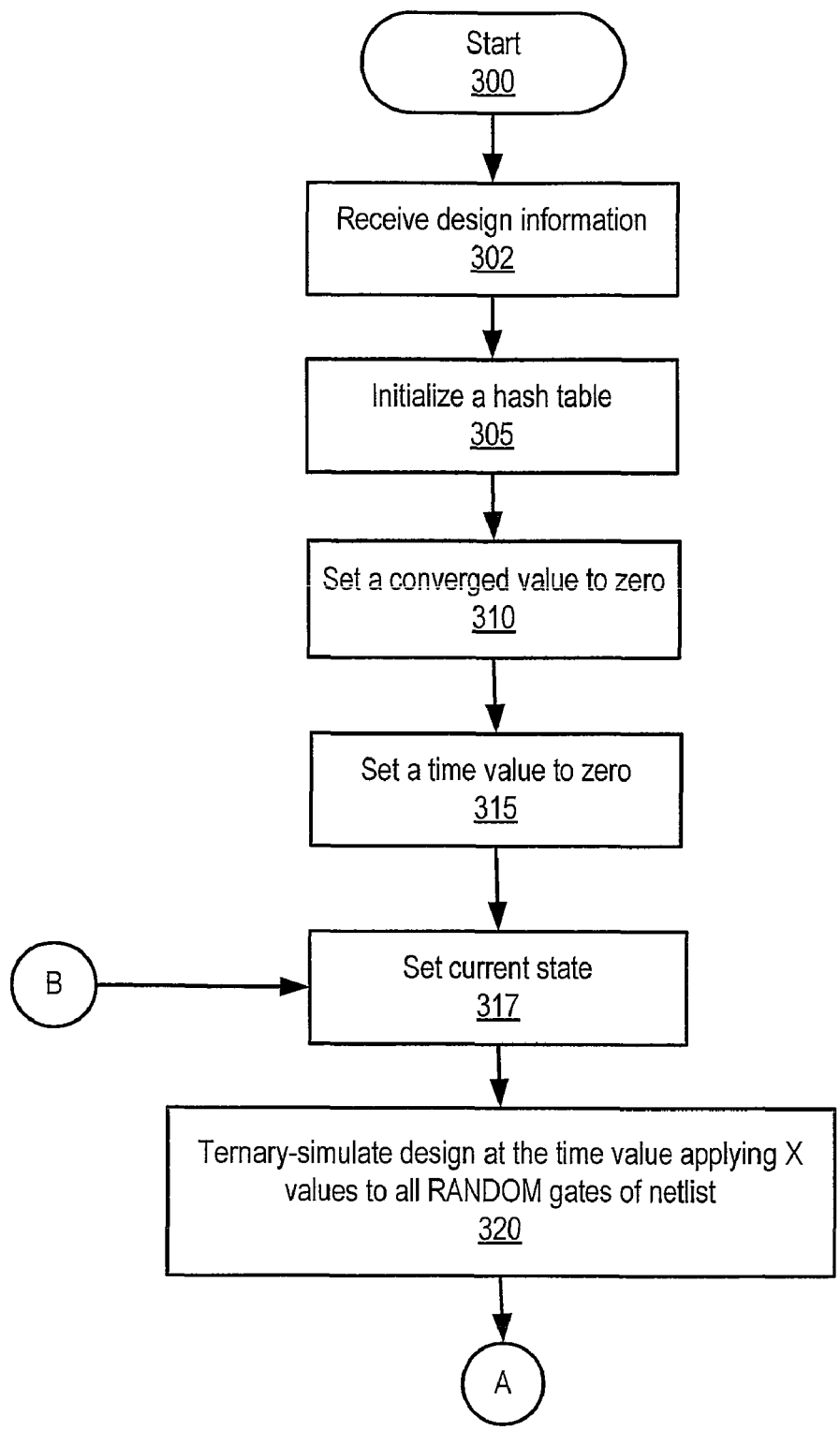
FIGS. 3A-3C illustrate a method for reducing a size of a design using ternary simulation, according to one or more embodiments.
Figure 3B:
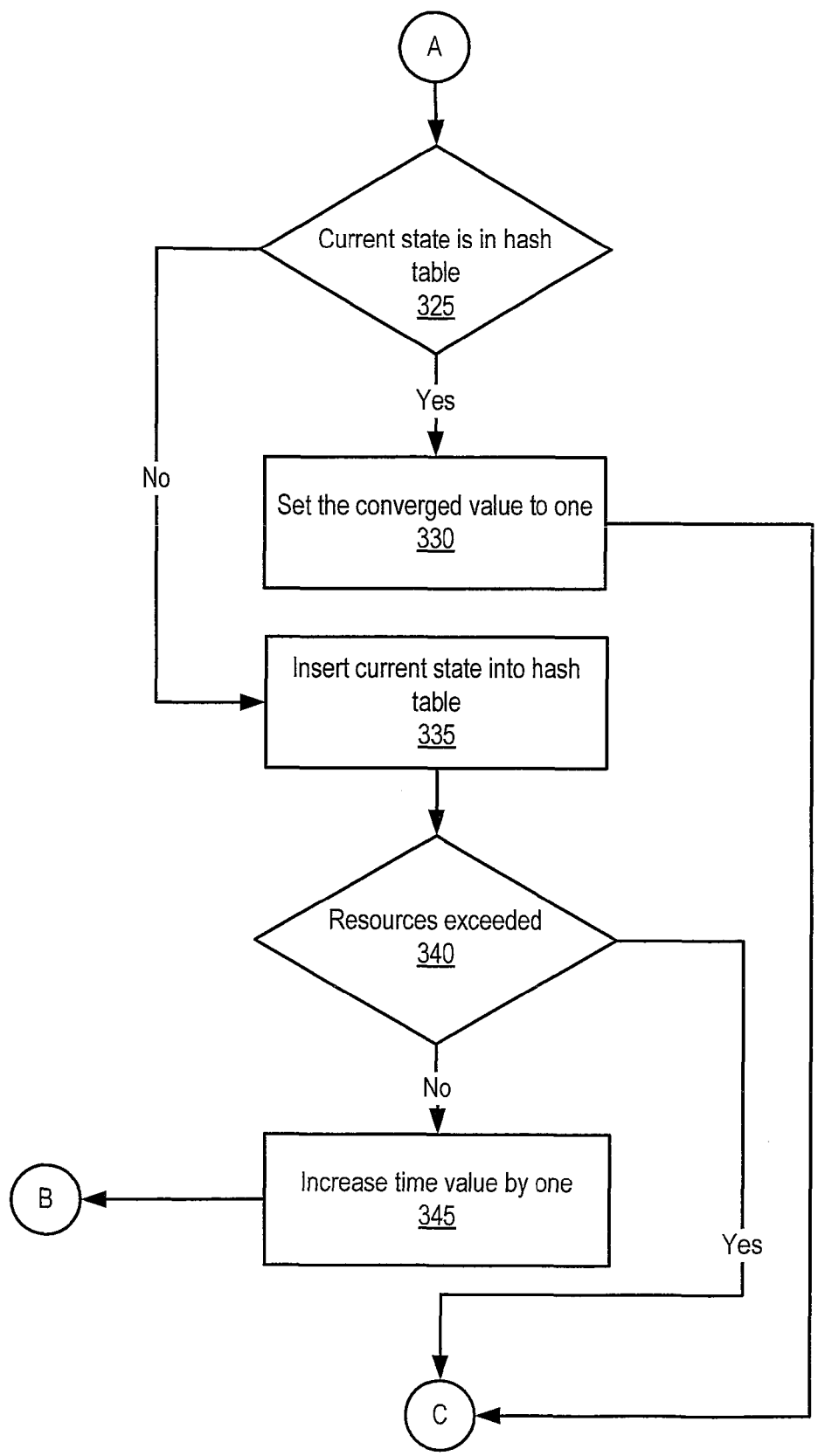
Figure 3C:
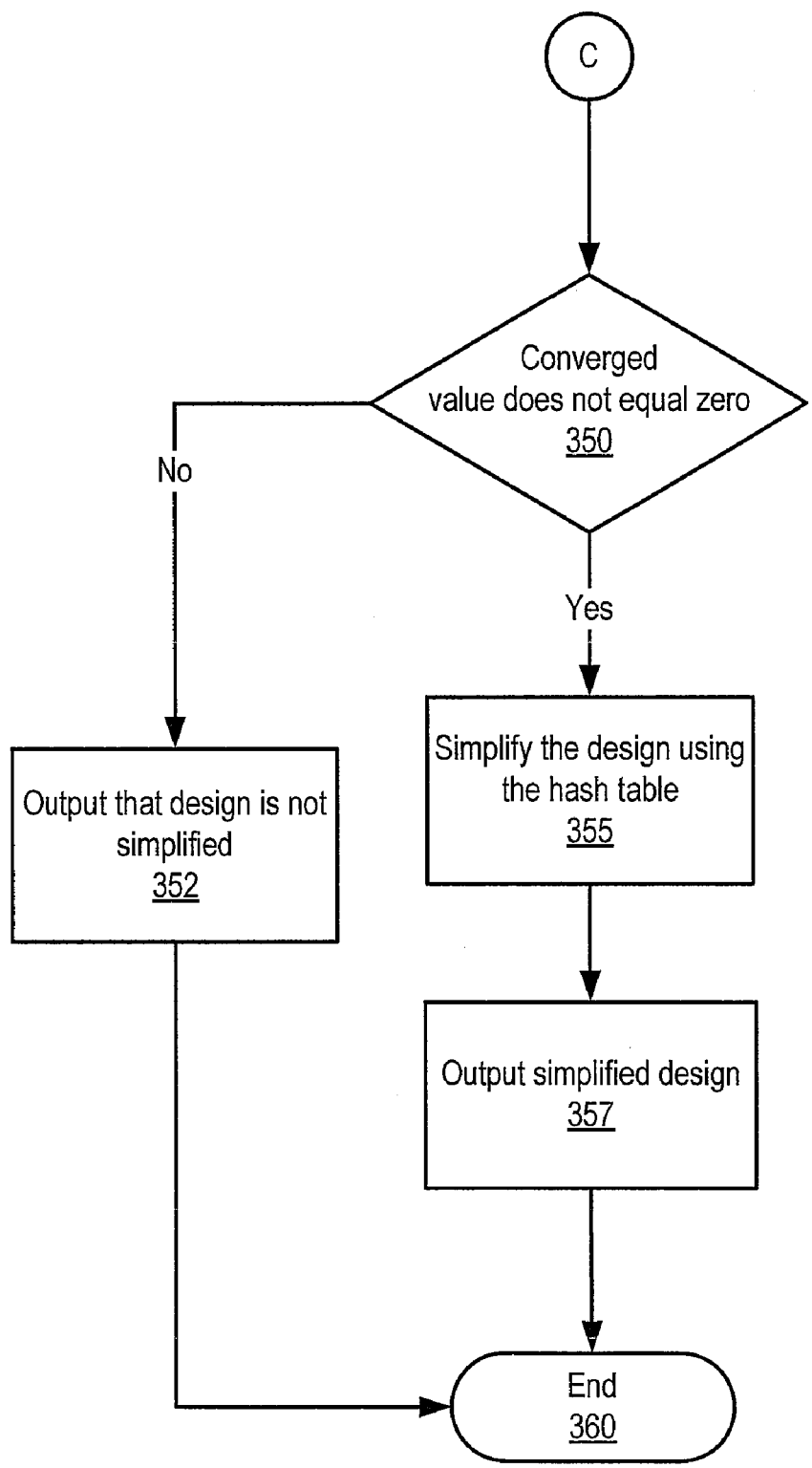

Turning now to FIGS. 3A-3C, a method for reducing the size of a design is illustrated, in accordance with one or more embodiments. Although the method illustrated in FIGS. 3A-3C may be described with reference to components shown in FIGS. 1-2, it should be understood that this is merely for convenience and alternative components and/or configurations thereof can be employed with implementing one or more methods. Key portions of the method illustrated in FIGS. 3A-3C can be completed by XSTS utility 145 executing on CPU 110 within DPS 100 and controlling specific operations of/on DPS 100. The method is, thus, described from the perspective of either/both XSTS utility 145 and DPS 100.

The method of FIGS. 3A-3C begins at block 300 and proceeds to block 302 where XSTS utility 145 receives design information. The design information includes a netlist and/or information that indicate the netlist or a location of the netlist, and the design information can be received from one or more of a user, an application, a data file, database, a memory, a disk, a network, etc. At block 305 XSTS utility 145 initializes a hash table. For example, initializing the hash table can include allocating memory (e.g., RAM, disk space, etc.) and/or setting one or more values in the hash table to a default value. At block 310, XSTS utility 145 a converged value is set to zero (e.g., a logical false value), and at block 315, XSTS utility 145 sets a time value to zero (e.g., an initial time). At block 317, XSTS utility 145 sets and/or initializes a current state (e.g., a current state of the method or process being performed). In one or more embodiments, the current state can be stored in one or more values (e.g., one or more values of a data structure stored in a memory and/or a disk). At block 320, XSTS utility 145 performs ternary-simulates a design at the time value applying "X" values to all RANDOM gates of a netlist of the design. At block 325, XSTS utility 145 determines whether or not the current state is in the hash table.

If the current state is in the hash table, XSTS utility 145 proceeds to block 330 and sets the converged value to one (e.g., a logical true value). At block 350, XSTS utility 145 determined whether or not the converged value does not equal zero (e.g., a logical not false value). If the converged value does not equal zero, XSTS utility 145 simplifies the design using the hash table information at block 355 and proceeds to block 357 where XSTS utility 145 outputs the simplified design. For example, XSTS utility 145 can output the simplified design to one or more of a display, a memory medium (e.g., random access memory, non-volatile memory, network accessible memory, etc.), and a network (e.g., a local area network, a wide area network, a public network such as an Internet, etc.), among others. XSTS utility 145 proceeds to block 360 where XSTS utility 145 ends the method. If the converged value equals zero, XSTS utility 145 proceeds to block 352 where XSTS utility 145 outputs that the design is not simplified. For example, XSTS utility 145 can output that the design is not simplified to one or more of a display, a memory medium (e.g., random access memory, non-volatile memory, network accessible memory, etc.), and a network (e.g., a local area network, a wide area network, a public network such as an Internet, etc.), among others. XSTS utility 145 proceeds to block 360 where XSTS utility 145 ends the method.

If the current state is not in the hash table (with reference to block 325), XSTS utility 145 proceeds to block 335, where XSTS utility 145 inserts the current state into the hash table. At block 340, XSTS utility 145 determines whether or not resources are exceeded. For example, the resources may include memory, disk space, time (e.g., wall clock time), and/or a time value upper bound (e.g., an upper bound for a number of iterations), among others. If the resources are not exceeded, XSTS utility 145 proceeds to block 345, where XSTS utility 145 increases the time value by one and proceeds to block 317. If the resources are exceeded, XSTS utility 145 proceeds to block 350.

With reference to the method illustrated in FIGS. 3A-3C, XSTS utility 145 injects "X" values for all RANDOM gates until the current state of the design repeats an earlier state or until resources are exceeded. If resources are exceeded, then this indicates that XSTS utility 145 was unable determine a convergence, and, hence, no reductions based upon the partial data were possible. Otherwise, a state has been repeated. For example, at some time "i" the state occurred, and at some later time "i+j" the state occurred again. In one or more embodiments, this state repetition can indicate that the behavior from time "i" to "i+j" may be repeated infinitely. Since the "X" values for RANDOMs represent any possible sequence of Boolean valuations to these gates, the corresponding sequence of values determined by XSTS utility 145 during this repetition represents an exhaustive behavior of the design. Thus, XSTS utility 145 at block 355 can use information of the states stored in the hash table to determine a simplification potential. In one or more embodiments, one or more input parameters can require that simplified gates can never evaluate to "X" while XSTS utility 145 performs the method illustrated in FIGS. 3A-3C from time "0" (e.g., initial state) to "i+j". For example, if a gate always evaluates to a constant "0" or a constant "1" in states stored in the hash table, the gate can be merged to its constant value. Similarly, if XSTS utility 145 determines that two gates always evaluate to the same non-"X" value in states stored in the hash table, the two gates can be merged together. In one or more embodiments, XSTS utility 145 cannot merge a gate that evaluates to an "X", since the gate's behavior has not been determined as being equal to a constant or to another gate.

A possible drawback of ternary simulation-based reduction is that convergence may not occur within a reasonable execution time for certain design styles. In one example, a design may include a (large) counter, e.g., a 64-bit counter. A ternary simulation of such a design may not converge until $2^{64}$ (i.e., 2 to the power of 64) time frames or iterations. In another example, a design can include a Linear Feedback Shift Register (LFSR) where a ternary simulation will not converge until a number of time steps or iterations exceeds a period of the LFSR.

Thus, in one or more embodiments, XSTS utility 145 uses "X-saturation" to accelerate convergence of a ternary simulation (i.e., reducing a number of ternary simulation time frames or iterations until a repetition is detected). In some instances, convergence does not occur because some gates depart from their "regular prefix behavior" up until a specific number of time frames or iterations. In one example with reference to the 64-bit counter discussed above, a limit of at most $2^{10}$ or 1024 time frames or iterations in a simulation for this counter is possible. For instance, a property of counters includes the nth least significant bit toggles every $2^{(n-1)}$, i.e., 2 to the power of n−1, time frames or iterations. Thus, at the 1023rd time step or iteration, XSTS utility 145 can determine that the lower 10 bits of the counter behave periodically and the upper 54 bits of the counter have constant values of "0". At and/or after the 1024th tine-frame, the 11th least significant bit toggles. Accordingly, in one or more embodiments, XSTS utility 145 replaces such gates that depart from their regular prefix behavior by the value "X". This aids in convergence without exhausting available resources. In the 64-bit counter example, by "X-saturating" bit 11 after $2^{10}$ time frames or iterations of the ternary simulation, bit 12 can toggle after another $2^{10}$ time frames or iterations of the ternary simulation. If XSTS utility 145 turns "X-saturate" bit 12 at that point, bit 13 can toggle after another $2^{10}$ time frame or iterations instead of $2^{11}$ time frames or iterations. Accordingly, XSTS utility 145 can saturate earlier.

In one or more embodiments, XSTS utility 145 may limit the analysis to gates that depart from their expected behavior to only registers alone. For instance, registers can be a root cause of behavior departures since RANDOMs always evaluate to "X" and every other gate is a combinational function of registers and RANDOMs. By replacing such registers by "X", XSTS utility 145 breaks the dependence of subsequent regular prefix behavior departure of other registers on the signals being "X-saturated". For example, a netlist may include M registers which would depart from their regular prefix behavior. After XSTS utility 145 begins "X-saturation" at time N, XSTS utility 145 will converge a simulation within N*M (i.e., N multiplied by M) time frames or iterations, whereas without "X-saturation" convergence may not happen until $N*2^M$ (i.e., N multiplied by 2 to the power of M) timeframes or iterations. An exemplary modified version of the ternary simulation framework, that integrates X-saturation, is provided as a method illustrated in FIGS. 4A-4C, according to one or more embodiments. One difference is that upon some configurable X_SATURATION_TIME value (e.g., configurable by a user, an application, from a data file and/or database, etc.), XSTS utility 145 will check to see if an unsaturated register departs from its prefix behavior. For example, if the register has been constant "0" until the X_SATURATION_TIME and if XSTS utility 145 determines a change of value from "0" to "1" at a current time frame or iteration, the register has departed from its prefix behavior. When XSTS utility 145 determines such a departure, XSTS utility 145 marks the register as "X-saturated", and thereafter XSTS utility 145 will evaluate the register to "X". In one or more embodiments, reductions based upon "X-saturated" values are still valid, since "X-saturation" may only reduce the amount of merging that will occur (i.e., XSTS utility 145 cannot merge a gate that evaluates to "X"), and convergence through state repetition over-approximated for all possible design behavior.

Figure 4A:
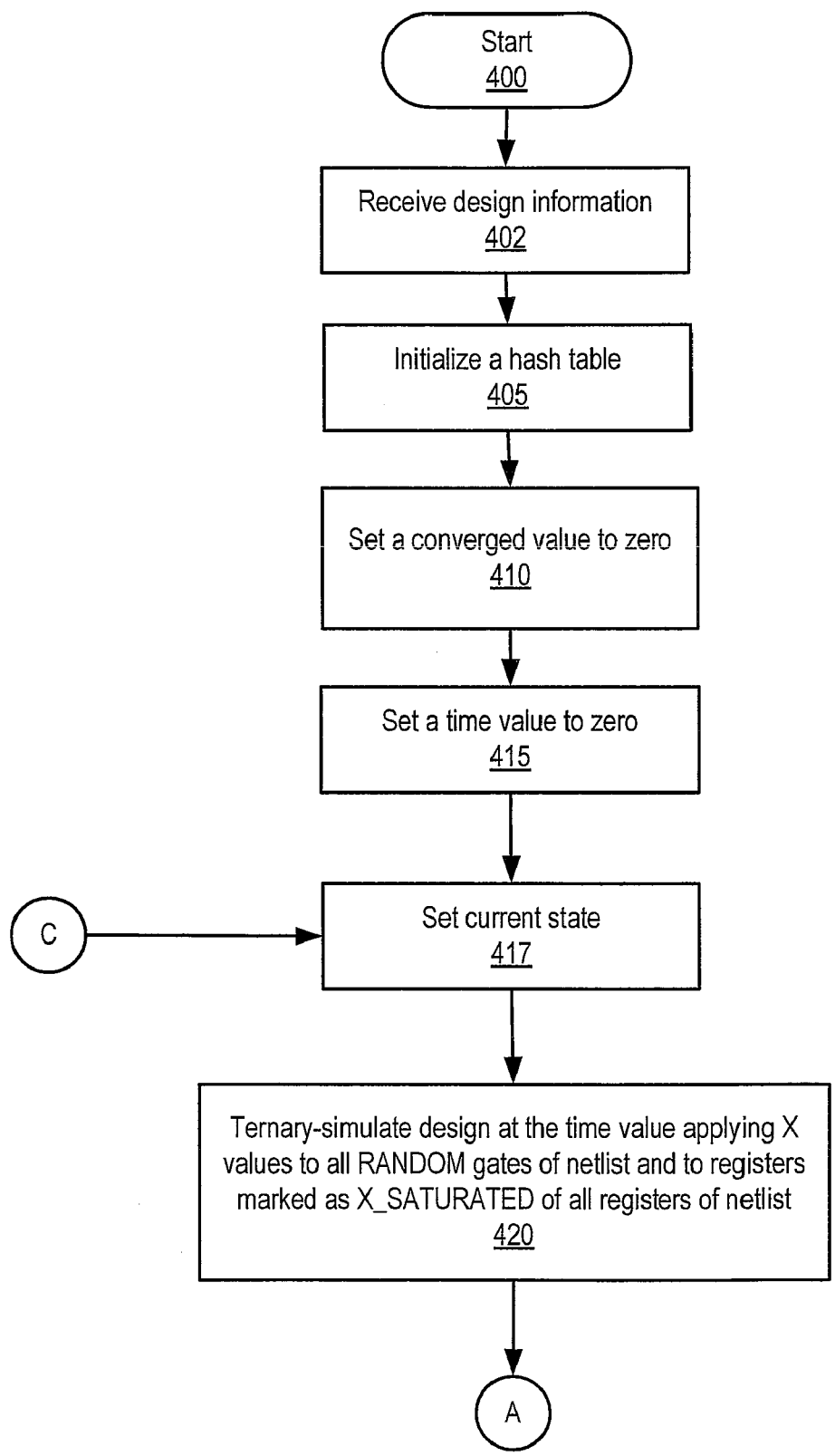
FIGS. 4A-4C illustrate a modified version of a ternary simulation framework for reducing a size of a design using ternary simulation, according to one or more embodiments.
Figure 4B:
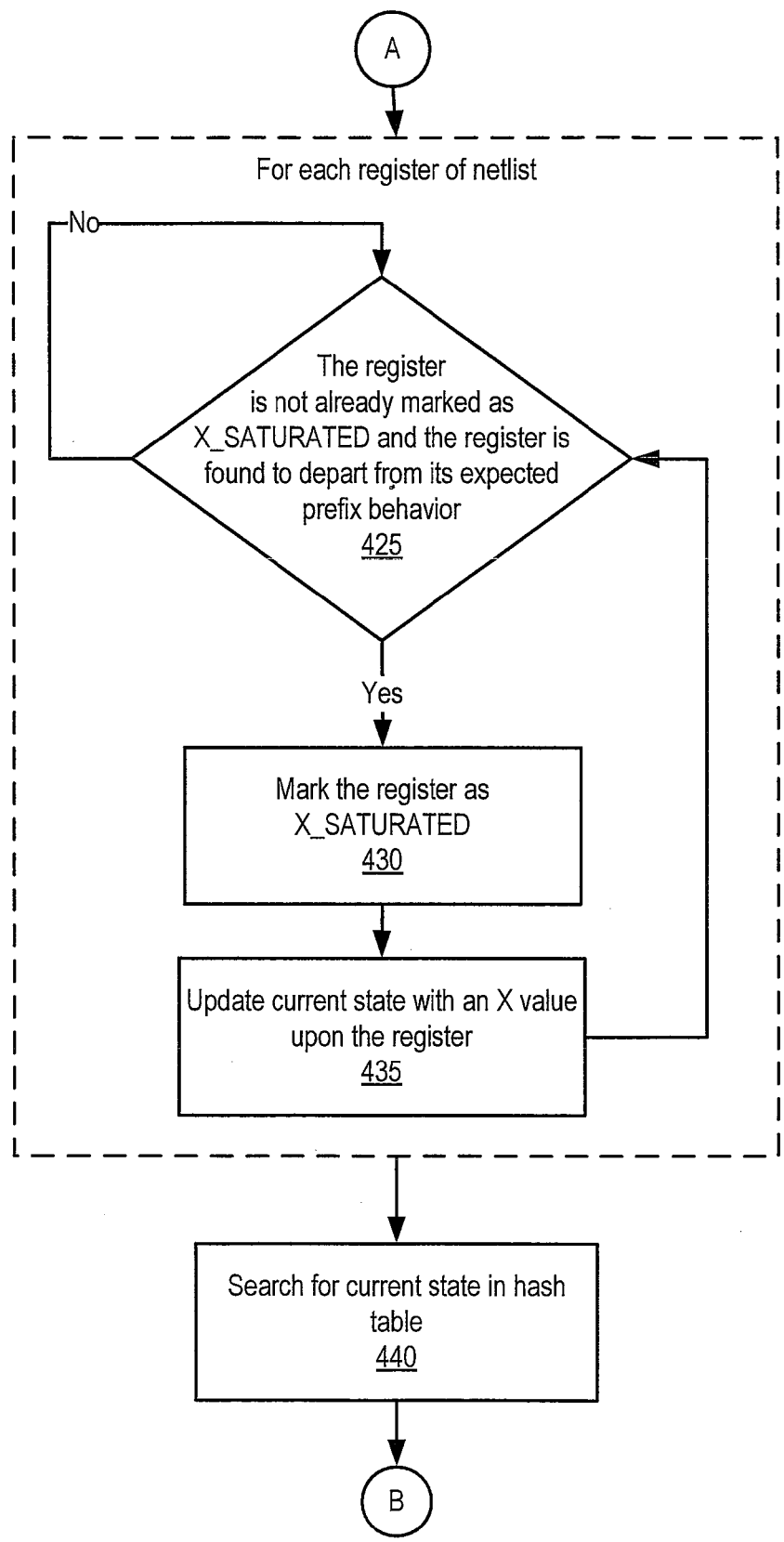
Figure 4C:
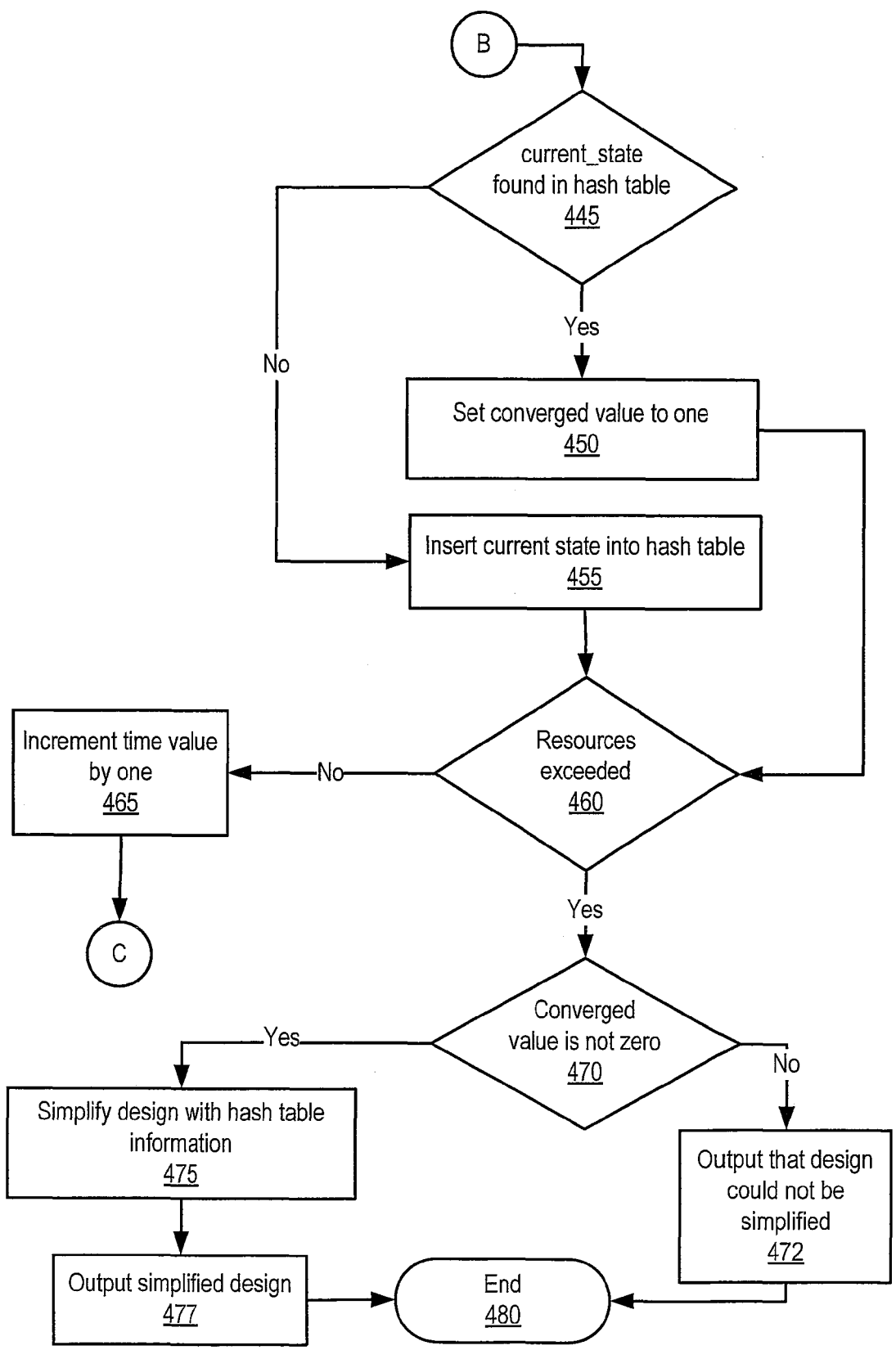
Figure 5A:
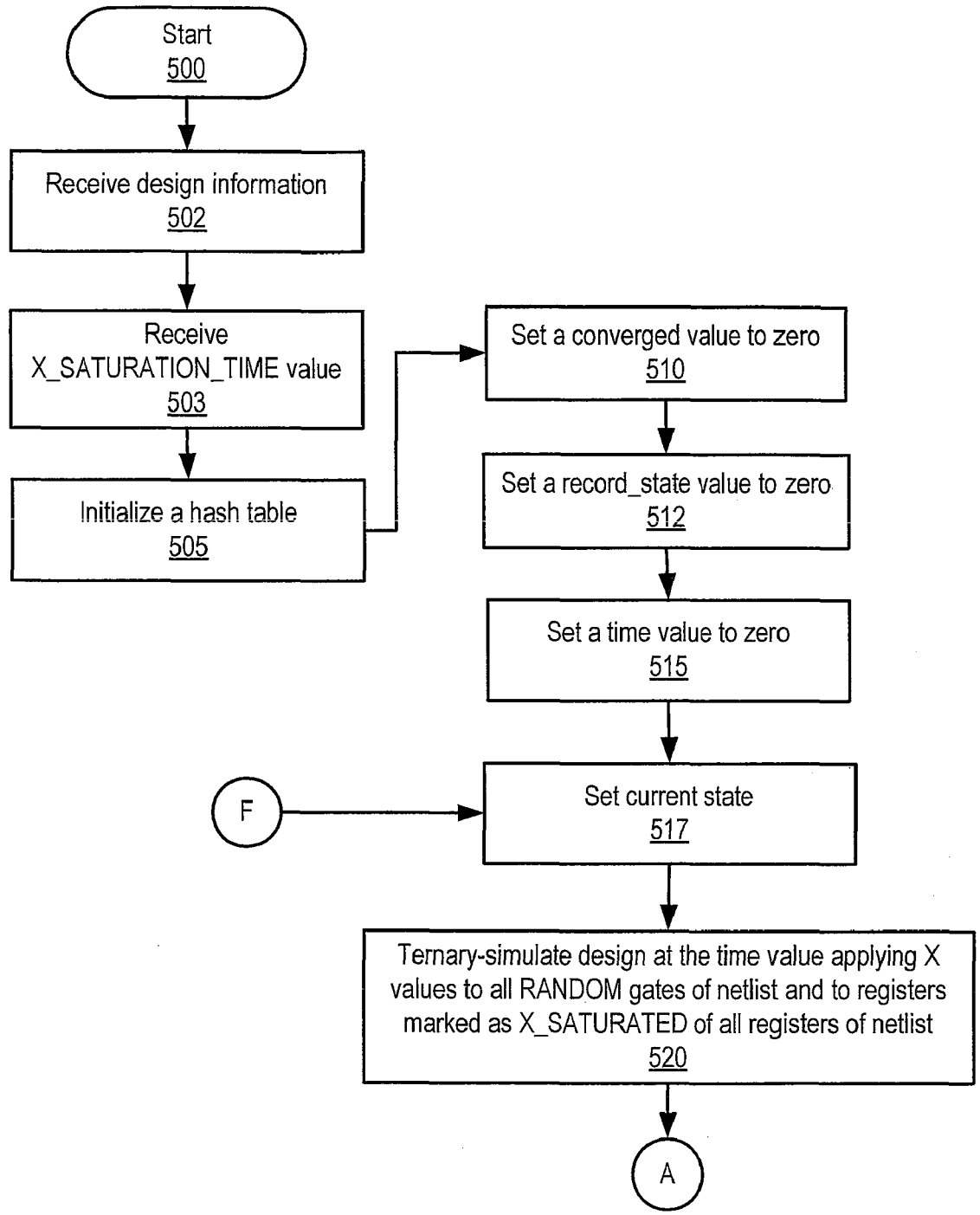
FIGS. 5A-5D illustrate a method for reducing the size of a design which avoids redundant prefix checks, according to one or more embodiments.
Figure 5B:
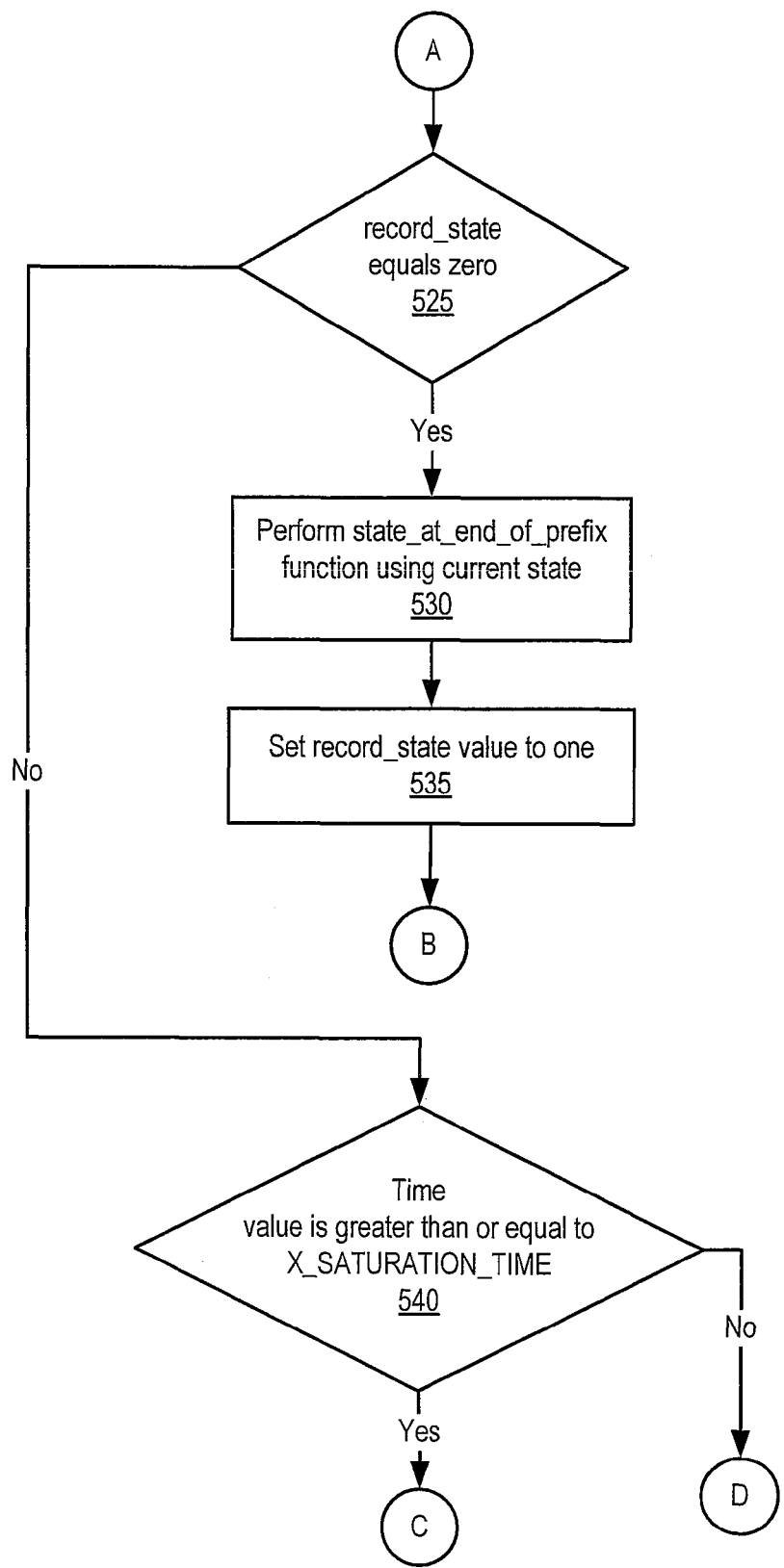
Figure 5C:
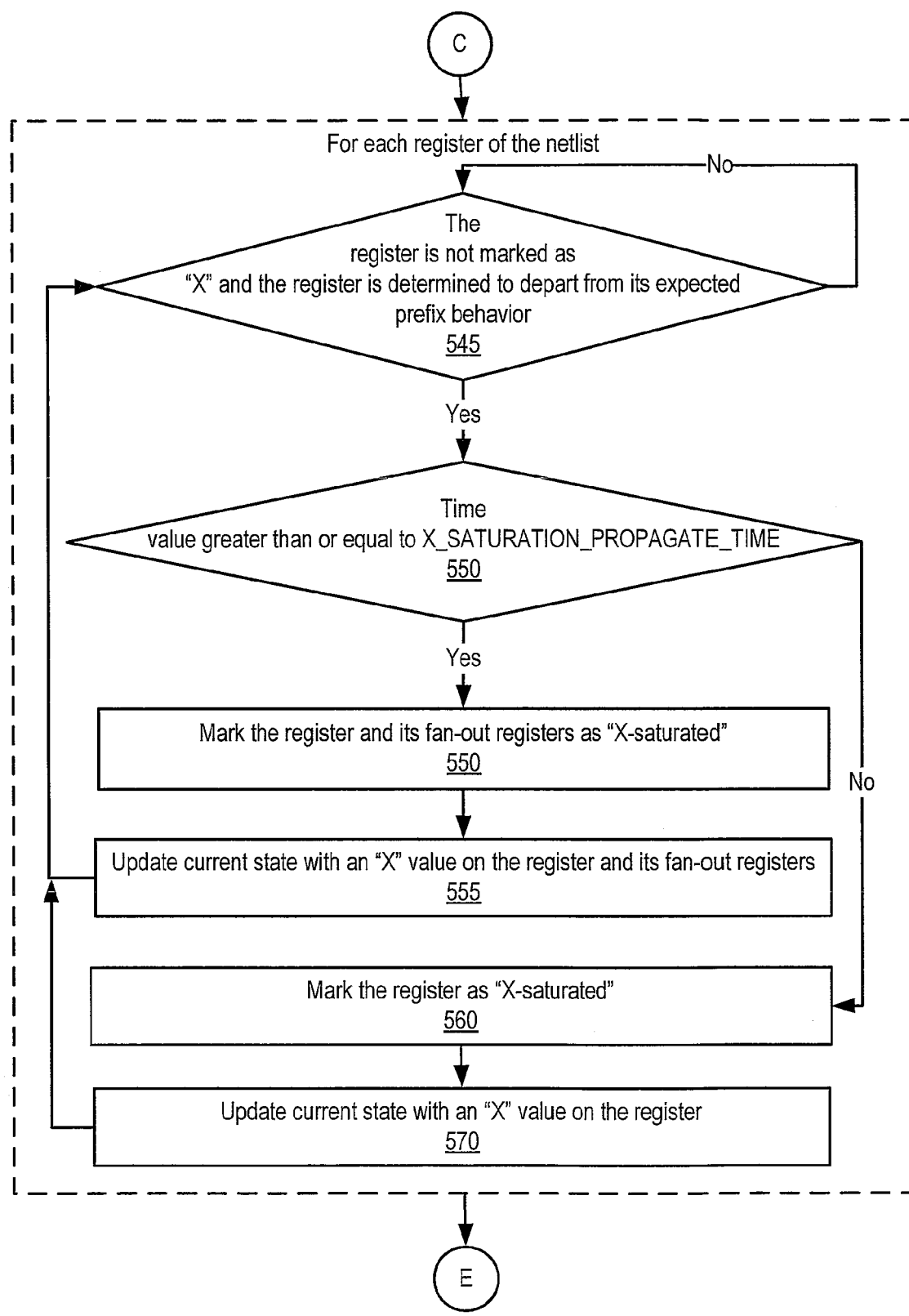
Figure 5D:
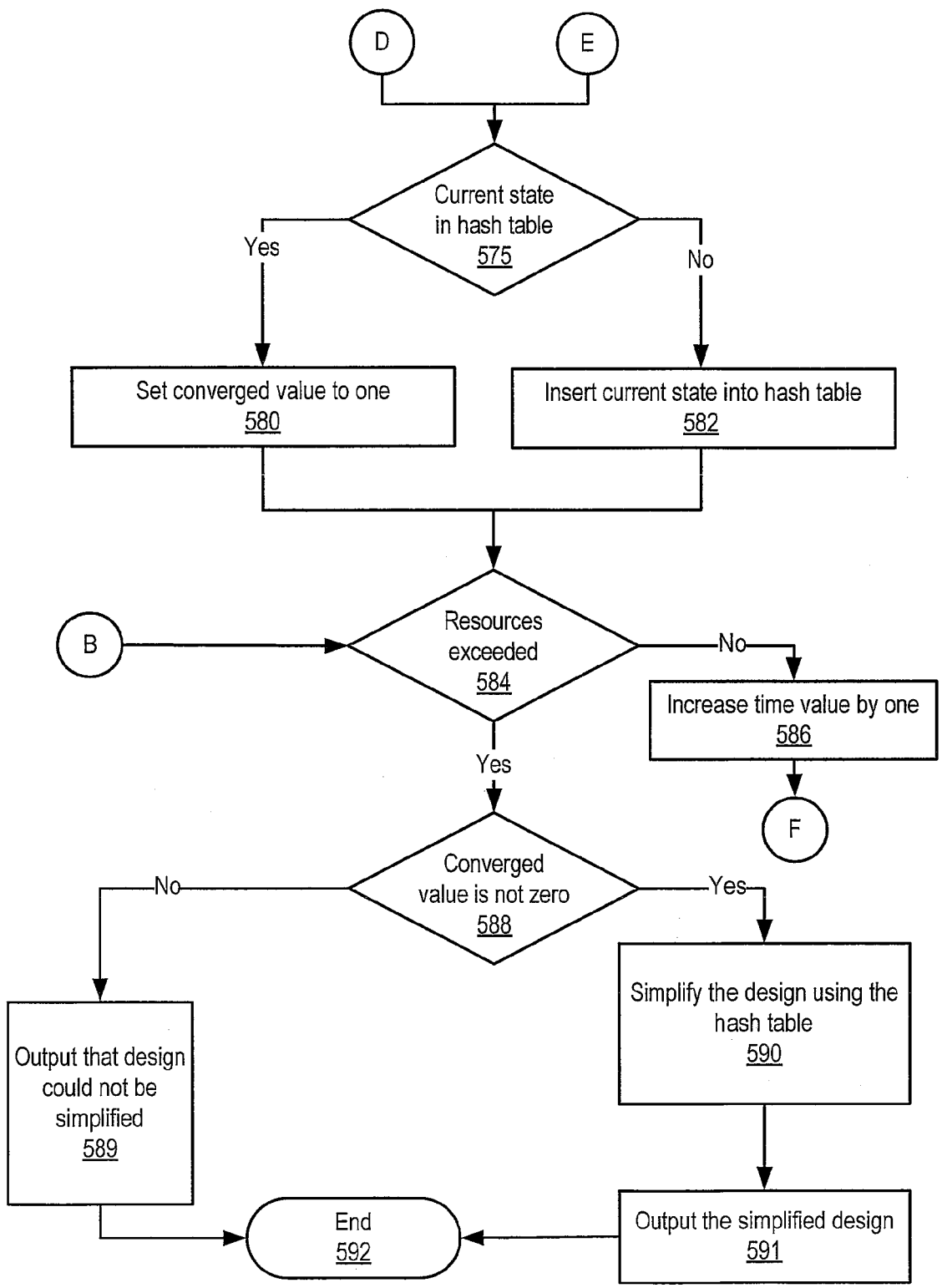

Turning now to FIGS. 4A-4C, a method for reducing the size of a design is illustrated, in accordance with one or more embodiments. Although the method illustrated in FIGS. 4A-4C can be described with reference to components shown in FIGS. 1-2, it should be understood that this is merely for convenience and alternative components and/or configurations thereof can be employed with implementing one or more methods. Key portions of the method illustrated in FIGS. 4A-4C can be completed by XSTS utility 145 executing on CPU 110 within DPS 100 and controlling specific operations of/on DPS 100. The method is, thus, described from the perspective of either/both XSTS utility 145 and DPS 100.

The method of FIGS. 4A-4C begins at block 400 and proceeds to block 402 where XSTS utility 145 receives design information. The design information includes a netlist and/or information that indicate the netlist or a location of the netlist, and the design information can be received from one or more of a user, an application, a data file, database, a memory, a disk, a network, etc. At block 405 XSTS utility 145 initializes a hash table. For example, initializing the hash table can include allocating memory (e.g., RAM, disk space, etc.) and/or setting one or more values in the hash table to a default value. At block 410, XSTS utility 145 sets a converged value to zero (e.g., a logical false value), and at block 415, XSTS utility 145 sets a time value to zero (e.g., an initial time). At block 417, XSTS utility 145 sets a current state (e.g., a current state of the method or process being performed). In one or more embodiments, the current state can be stored in one or more values (e.g., one or more values of a data structure stored in a memory and/or a disk). At block 420, XSTS utility 145 ternary-simulates a design at the time value applying "X" values to all RANDOM gates of a netlist of the design and to registers marked as X_SATURATED of all registers of the netlist of the design.

For each register of the netlist of the design, XSTS utility 145 performs one or more of blocks 425-435, as shown. At block 425, XSTS utility 145 determines whether or not the register is not already marked as X_SATURATED and the register is found to depart from its expected prefix behavior. If so, XSTS utility 145 proceeds to block 430, and XSTS utility 145 marks the register as X_SATURATED. At block 435, XSTS utility 145 updates the current state with an "X" value upon the register.

At block 440, XSTS utility 145 searches for the current state in the hash table. At block 445, XSTS utility 145 determines whether or not the current state is found in the hash table. If the current state is found in the hash table, XSTS utility 145 proceeds to block 450, where XSTS utility 145 sets the converged value to a non-zero value, and XSTS utility 145 proceeds to block 460. If the current state is not found in the hash table, XSTS utility 145 proceeds to block 455, where XSTS utility 145 inserts the current state into the hash table, and XSTS utility 145 proceeds to block 460. At block 460, XSTS utility 145 determines whether or not the resources have been exceeded. For example, the resources may include memory, disk space, time (e.g., wall clock time), and/or a time value upper bound (e.g., an upper bound for a number of time frames or iterations), among others. If resources have not been exceeded, XSTS utility 145 proceeds to block 465, where XSTS utility 145 increments the time value by one, and XSTS utility 145 proceeds to block 417. If the resources have been exceeded, XSTS utility 145 proceeds to block 470, where XSTS utility 145 determines whether or not the converged value is not equal to zero (e.g., a logical false value). If the converged value is equal to zero, XSTS utility 145 proceeds to block 472 where XSTS utility 145 outputs that the design is not simplified. For example, XSTS utility 145 can output that the design is not simplified to one or more of a display, a memory medium (e.g., random access memory, non-volatile memory, network accessible memory, etc.), and a network (e.g., a local area network, a wide area network, a public network such as an Internet, etc.), among others. At block 480, XSTS utility 145 ends the method. If the converged value is not equal to zero (e.g., a logical value that is not false), XSTS utility 145 simplifies the design using the hash table information at block 475. At block 477, XSTS utility 145 outputs the simplified design. For example, XSTS utility 145 can output the simplified design to one or more of a display, a memory medium (e.g., random access memory, non-volatile memory, network accessible memory, etc.), and a network (e.g., a local area network, a wide area network, a public network such as an Internet, etc.), among others. XSTS utility 145 proceeds to block 480, where the method ends.

100431 In one or more embodiments, XSTS utility 145 may enhance an optimality of reductions once "X-saturation" is invoked. For instance, during "X-saturation", XSTS utility 145 saturates gates whose behavior is determined to depart from their respective expected prefix behaviors. It is noted that gates which behave periodically (e.g., for a period that is reasonably small) or as constants may not prohibit an ability of a ternary simulation to converge, since those gates retain their respective behaviors throughout the simulation process regardless of how long the simulation process continues. However, any other type of gate could prohibit convergence. For optimality, one importance is XSTS utility 145 minimizing the number of "X-saturated" gates, since any gate that evaluates to "X" may not be eliminated. Hence, XSTS utility 145 identifies those gates that could prohibit convergence in determining an optimal ternary-simulation based reductions within a fixed number of time frames or iterations. XSTS utility 145 performs this in the block 425 (see FIG. 4B) which checks whether a register departs from its expected behavior. In one or more embodiments, at block 425, XSTS utility 145 checks the register being of constant behavior or periodic behavior up to a configurable MAX_PERIOD value for a number of time frames or iterations. For example, MAX_PERIOD would be set smaller than X_SATURATION_TIME. Gates that cannot be identified as constant or periodic (e.g., as adequately small oscillators) will be "X-saturated" in block 430. In one or more embodiments XSTS utility 145 can: perform block 425 multiple times; XSTS utility 145 can incrementally process a result, i.e., XSTS utility 145 can store the result of prior checks to denote a constant versus a periodic behavior; and when the gates are re-checked at later time frames or iterations, XSTS utility 145 can only check those time frames or iterations (versus earlier time frames or iterations) to determine if the behavior of respective gates has been departed.

In one or more embodiments, XSTS utility 145 can relax the periodic check to be a delayed periodic check (i.e., after some initial number of time frames or iterations during which a gate may behave erratically), and XSTS utility 145 can, thereafter, check for periodic behavior. In an example, XSTS utility 145 performs the delayed periodic check in two ways: (1) the time frame or iteration after which XSTS utility 145 checks gate behavior may be controlled using a MIN_CONSISTENT_TIMEFRAME parameter (e.g., a configurable number of time frames or iterations); and (2) as discussed further below, a netlist could have an initial set of time frames or iterations where the netlist monotonically acquires more or less "X" values. In one or more embodiments, XSTS utility 145 uses the termination of the initial set of time frames or iterations to represent a time frame or iteration where XSTS utility 145 begins checking for regular behavior of gates.

As discussed above regarding the 64-bit counter, even with "X-saturation", XSTS utility 145 may require a large number of time frames or iteration to achieve a convergence. Thus, in one or more embodiments, XSTS utility 145 may employ a secondary "X-saturation" mechanism to ensure that a ternary simulation converges within a specified bound. For example, while a particular dependency of other registers on another register being "X-saturated" may be broken, there may still be a dependency on other gates (e.g., lower-order counter bits, which have periodic behavior with adequately small periodicity). XSTS utility 145 can overcome this issue by propagating "X" values upon saturation to a set of registers in a fan-out of those gates being saturated. In other words, rather than merely saturating register "r" at a point in time, XSTS utility 145 can identify those registers in the fan-out of "r" and saturate those as well. In one or more embodiments, XSTS utility 145 uses this "X-propagation" mechanism or process at a later time frame or iteration than the X_SATURATION_TIME, e.g., as the simulation nears a final time frame or iteration to simulate with reasonable overall computational resources and/or to enable optimal ternary simulation based reductions with fixed and/or bounded resources. The later time frame or iteration is referred to as X_SATURATION_PROPAGATE_TIME with reference to the method illustrated in FIGS. 5A-5D described below.

In one or more embodiments, XSTS utility 145 determines that a later state can safely be treated as a match in the hash table versus an earlier state if every "0" and "1" register valuation from an earlier state is matched by the later state, and this can occur without requiring the "X" register valuations from the earlier state to match the later state. Accordingly, a determination whether or not the current state is in the hash table (in blocks 325 (see FIG. 3B) and/or 445 (see FIG. 4C)) may be relaxed to only look for matches against non-"X" values in earlier states. For example, if the later register valuation is an "X", XSTS utility 145 has determined an exact match, and the determination whether or not the current state is in the hash table can be relaxed. In another example, if XSTS utility 145 does not determine an exact match and the later register valuation is "0" or "1" (where an earlier "X" valuation was modeled either case), XSTS utility 145 determines a repetition of all other behaviors over "reducible" signals (which never evaluated to an "X"). In one or more embodiments, XSTS utility 145 performing the relaxation can allow convergence to be determined earlier and can be efficiently determined by using a "masked compare" between earlier and later states (e.g., ANDing away register valuations for registers where the earlier state was determined to be an "X" value).

In one or more embodiments, XSTS utility 145 determines that a ternary simulation monotonically increases a number of registers evaluating to "X" for a first several time frames or iterations (provided that initial states are primarily "0" and "1" values, as the "X" values from RANDOMS propagate through the design), or XSTS utility 145 determines that the ternary simulation monotonically decreases a number of registers evaluating to "X" for a first several time frames or iterations (provided that initial states are primarily "X" and some dedicated logic "deterministically resets" these registers). This can allow XSTS utility 145 to utilize a smaller hash table and, thus, enable faster processing as a result of less or fewer I/O operations (e.g., memory operations, disk operations, etc.). For example, XSTS utility 145 begins the ternary simulation process by neglecting a hashing of vectors until a monotonic increase or decrease has terminated, and XSTS utility 145 treats a register as "X" where the register evaluates to "X" as XSTS utility 145 begins hashing. Accordingly, XSTS utility 145 can avoid representing registers with "X" valuations in the hash signatures of the hash table.

During an initial time-frame or iteration, a chance of matching an earlier state is very small or non-existent. In the case where "X" valuations are monotonically increasing, the chance is also very small or non-existent, since increasing numbers of later "X" valuations cannot (or should not) match against a lesser number of earlier "X" valuations. In the case where "X" valuations are monotonically decreasing, some non-"X" state machine driving behavior can exist which acts as a "reset device" to clear the initial "X" valuations. In one or more instances, the early time frames or iterations can provide states of this reset device that cannot be determined at later time frames or iterations. Accordingly, XSTS utility 145 not recording these early time-frames will not delay convergence.

In accordance with one or more embodiments, a modified version of the method illustrated in FIGS. 4A-4C is provided in FIGS. 5A-5D which incorporates the extensions described above. The value "record_state" initializes to 0, and stays 0 until the initial "prefix trend" (detected by a function "state_at_end_of_prefix") has terminated. For example, XSTS utility 145 performs the state_at_end_of_prefix function, and the state_at_end_of_prefix function can be configured to return a logical "true" value when a prefix trend of monotonically increasing or monotonically decreasing "X" values is determined to end or conclude. While record state remains 0, the method refrains from processing and/or performing subsequent state recording(s) and determining behavior(s).

Turning now to FIGS. 5A-5D, a method for reducing the size of a design which avoids redundant prefix checks is illustrated, in accordance with one or more embodiments. Although the method illustrated in FIGS. 5A-5D can be described with reference to components shown in FIGS. 1-2, it should be understood that this is merely for convenience and alternative components and/or configurations thereof can be employed with implementing one or more methods. Key portions of the method illustrated in FIGS. 5A-5D can be completed by XSTS utility 145 executing on CPU 110 within DPS 100 and controlling specific operations of/on DPS 100. The method is, thus, described from the perspective of either/both XSTS utility 145 and DPS 100.

The method of FIGS. 5A-5D begins at block 500 and proceeds to block 502 where XSTS utility 145 receives design information. The design information includes a netlist and/or information that indicates the netlist or a location of the netlist. At block 503, XSTS utility 145 receives an X_SATURATION_TIME value. The design information and/or the X_SATURATION_TIME value can be received from one or more of a user, an application, a data file, database, a memory, a disk, a network, etc. At block 505, XSTS utility 145 initializes a hash table. For example, initializing the hash table may include allocating memory (e.g., RAM, disk space, etc.) and/or setting values in the hash table to a default value. At block 510, XSTS utility 145 sets a converged value to zero (e.g., a logical false value), and at block 515, XSTS utility 145 sets a time value to zero (e.g., an initial time). At block 517, XSTS utility 145 sets a current state. In one or more embodiments, the current state includes a data structure that includes one or more values and/or variables of a time frame or iteration of the method being performed by XSTS utility 145. At block 520, XSTS utility 145 performs a ternary-simulation on a design at the time value applying "X" values to all RANDOM gates of the netlist of the design and to registers marked as X_SATURATED of all registers of the netlist of the design. At block 525, XSTS utility 145 determines if record_state equals zero. If record_state equals zero, XSTS utility 145 proceeds to block 530, where XSTS utility 145 performs the state_at_end_of_prefix function (described above) using the current state. At block 535, XSTS utility 145 sets record_state to one and proceeds to block 584.

If record_state does not equal zero, XSTS utility 145 proceeds to block 540, where XSTS utility 145 determines whether or not the time value is greater than or equal to X_SATURATION_TIME. If the time value is not greater than or equal to X_SATURATION_TIME, then XSTS utility 145 proceeds to block 575. If the time value is greater than or equal to X_SATURATION_TIME, then XSTS utility 145 proceeds to block 545.

In one or more embodiments, XSTS utility 145 performs one or more of blocks 545-570 for each register of the netlist, as shown. At block 545, XSTS utility 145 determines whether or not the register is not marked as "X" and that the register is determined to depart from its expected prefix behavior. If the register is not marked as "X" and the register is determined to depart from its expected prefix behavior, XSTS utility 145 proceeds to block 550, where XSTS utility 145 determines whether or not the time value is greater than or equal to X_SATURATION_PROPAGATE_TIME. If the time value is greater than or equal to X_SATURATION_PROPAGATE_TIME, XSTS utility 145 proceeds to block 550, where XSTS utility 145 marks the register and its fan-out registers as "X-saturated". At block 555, XSTS utility 145 updates current state with an "X" value on the register and its fan-out registers. If the time value is not greater than or equal to X_SATURATION_PROPAGATE_TIME, XSTS utility 145 proceeds to block 560, where XSTS utility 145 marks the register as "X-saturated". At block 570, XSTS utility 145 updates current state with an "X" value on the register.

XSTS utility 145 proceeds to block 575. At block 575, XSTS utility 145 determines whether or not the current state is in the hash table. If the current state is in the hash table, XSTS utility 145 proceeds to block 580, where XSTS utility 145 sets the converged value to one. If the current state is not in the hash table, XSTS utility 145 proceeds to block 582, where XSTS utility 145 inserts the current state into the hash table. XSTS utility 145 proceeds to block 584. At block 584, XSTS utility 145 determines whether or not resources are exceeded. For example, the resources can include memory, disk space, time (e.g., wall clock time), and/or a time value upper bound (e.g., an upper bound for a number of iterations), among others. If resources are not exceeded, XSTS utility 145 proceeds to block 586, where XSTS utility 145 increases the time value by one and proceeds to block 517. If resources are exceeded, XSTS utility 145 proceeds to block 588, where XSTS utility 145 determines whether or not the converged value is not zero. If the converged value is not zero, XSTS utility 145 proceeds to block 590, where XSTS utility 145 simplifies the design using the hash table information. At block 591, XSTS utility 145 outputs the simplified design. For example, XSTS utility 145 can output the simplified design to one or more of a display, a memory medium (e.g., random access memory, non-volatile memory, network accessible memory, etc.), and a network (e.g., a local area network, a wide area network, a public network such as an Internet, etc.), among others. XSTS utility 145 proceeds to block 592, where the method ends. If the converged value is zero, XSTS utility 145 proceeds to block 472 where XSTS utility 145 outputs that the design is not simplified. For example, XSTS utility 145 can output that the design is not simplified to one or more of a display, a memory medium (e.g., random access memory, non-volatile memory, network accessible memory, etc.), and a network (e.g., a local area network, a wide area network, a public network such as an Internet, etc.), among others. At block 592, XSTS utility 145 ends the method.

As used herein, a hash table includes a data structure that can be indexed into by a value or key to store or access information associated with the value or key. In one or more embodiments, one or more of the methods described in the flow charts above can use one or more data management methods and/or mechanisms instead of or in addition to a hash table. For example, the one or more data management methods and/or mechanisms can include one or more of a database, a database management system (e.g., Oracle, MySQL, PostgreSQL, DB2, etc.), a flat file (ordered or unordered), heap(s), tree(s), XML file(s), etc. In one or more embodiments, the hash table and/or the one or more data management methods and/or mechanisms can be accessed using an application programming interface (API). In one or more instances, the API is not bound to a particular processing system. For example, the API can be used on a first processing system (e.g., DPS 100) and access the hash table and/or the one or more data management methods and/or mechanisms on a second processing system (e.g., server 165).

In the flow charts above, one or more of the methods are embodied in a computer readable medium including computer readable code such that a series of steps are performed when the computer readable code is executed (by a processing unit) on a computing device. In some implementations, certain processes of the methods are combined, performed simultaneously, concurrently (e.g., scheduled quick enough in time to appear simultaneous to a person), or in a different order, or perhaps omitted, without deviating from the spirit and scope of the invention. Thus, while the method processes are described and illustrated in a particular sequence, use of a specific sequence of processes is not meant to imply any limitations on the invention. Changes may be made with regards to the sequence of processes without departing from the spirit or scope of the present invention. Use of a particular sequence is therefore, not to be taken in a limiting sense, and the scope of the present invention extends to the appended claims and equivalents thereof.

As will be appreciated by one skilled in the art, the present invention may be embodied as a method, system, and/or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," "logic", or "system." Furthermore, the present invention may take the form of an article of manufacture having a computer program product with a computer-usable storage medium having computer-executable program instructions/code embodied in or on the medium.

As will be further appreciated, the processes in embodiments of the present invention may be implemented using any combination of software, firmware, microcode, and/or hardware. As a preparatory step to practicing the invention in software, the programming code (whether software or firmware) will typically be stored in one or more machine readable storage mediums such as fixed (hard) drives, diskettes, magnetic disks, optical disks, magnetic tape, semiconductor memories such as RAMs, ROMs, PROMs, etc., thereby making an article of manufacture in accordance with the invention. The article of manufacture including the programming code is used by either executing the code directly from the storage device, by copying the code from the storage device into another storage device such as a hard disk, RAM, etc., or by transmitting the code for remote execution using transmission type media such as digital and analog communication links. The medium may be electronic, magnetic, optical, electromagnetic, infrared, or semiconductor system (or apparatus or device) or a propagation medium. Further, the medium may be any apparatus that may include, store, communicate, propagate, or transport the program for use by or in connection with the execution system, apparatus, or device. The methods of the invention may be practiced by combining one or more machine-readable storage devices including the code according to the described embodiment(s) with appropriate processing hardware to execute the code included therein. An apparatus for practicing the invention could be one or more processing devices and storage systems including or having network access (via servers) to program(s) coded in accordance with the invention. In general, the term computer, computer system, or data processing system can be broadly defined to encompass any device having a processor (or processing unit) which executes instructions/code from a memory medium.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non-exclusive list of types of media, includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for simplifying at least a portion of an integrated circuit embodied by a netlist, comprising:
    (a) setting a current state;
    (b) simulating, in a ternary fashion, the netlist at a time value by applying logical X values to all RANDOM gates of the netlist and to registers marked X_SATURATED of all registers of the netlist, wherein the logical X values represent one of a "do not care" value and an undetermined value representing either 0 or 1;
    (c) for each register of the netlist:
        determining, by using a computer, whether or not the register is not already marked as X_SATURATED and the register is found to depart from its expected prefix behavior; and if the register is not already marked as X_SATURATED and the register is found to depart from its expected prefix behavior:
marking the register as X_SATURATED; and
updating the current state with an X value upon the register;
(d) searching for the current state in a hash table;
(e) determining whether or not the current state was found in the hash table;
(f) if the current state was found in the hash table, setting a converged value to one;
(g) if the current state was not found in the hash table, inserting the current state into the hash table;
(h) determining whether or not one or more computational and timing resources are exceeded;
(i) if the one or more resources are not exceeded:
incrementing the time value by one; and
repeating from step (a); and
(j) if the one or more resources are exceeded:
determining whether or not the converged value is not zero;
if the converged value is zero, indicating that the netlist could not be simplified; and
if the converged value is not zero:
simplifying the netlist using information from the hash table; and
outputting the simplified netlist.

2. The method of claim 1, further comprising:
receiving design information, wherein the design information includes the netlist;
initializing the hash table;
setting the converged value to zero; and
setting the time value to an initial value.

3. The method of claim 1, wherein:
the one or more resources includes an upper bound for a number of time frames; and
said determining whether or not one or more resources are exceeded includes determining whether or not the time value exceeds the upper bound.

4. The method of claim 3, further comprising:
receiving the upper bound for the number of time frames from one or more of a user, a memory, and a network.

5. The method of claim 1, wherein said initializing the hash table includes allocating space for the hash table in one or more of a memory and a disk.

6. The method of claim 1, further comprising:
receiving a X_SATURATION_TIME value;
receiving a X_SATURATION_PROPAGATE_TIME value;
determining that the time value is greater than or equal to the X_SATURATION_TIME value; and
for each register in the netlist:
determining whether or not the register is marked as X_SATURATED and the register is determined to depart from an expected prefix behavior of the register;
if the register is marked as X_SATURATED and the register is determined to depart from an expected prefix behavior of the register, determining whether or not the time value is greater than or equal to the X_SATURATION_PROPAGATE_TIME value;
if the time value is greater than or equal to the X_SATURATION_PROPAGATE_TIME value:
marking the register and fan-out registers of the register as X_SATURATED; and
updating the current state with an X value on the register and fan-out registers of the register; and if the time value is not greater than or equal to the X_SATURATION_PROPAGATE_TIME value:
marking the register as X_SATURATED; and
updating the current state with an X value on the register.

7. The method of claim 1, wherein a remote data processing system performs step (b).

8. A system for simplifying at least a portion of an integrated circuit embodied by a netlist, comprising:
a processor;
a memory medium coupled to the processor; and
a utility including instructions, which when executed on the processor, provides logic for performing the functions of:
(a) setting a current state;
(b) simulating, in a ternary fashion, the netlist at a time value by applying logical X values to all RANDOM gates of the netlist and to registers marked X_SATURATED of all registers of the netlist, wherein the logical X values represent one of a "do not care" value and an undetermined value representing either 0 or 1;
(c) for each register of the netlist:
determining whether or not the register is not already marked as X_SATURATED and the register is found to depart from its expected prefix behavior; and
if the register is not already marked as X_SATURATED and the register is found to depart from its expected prefix behavior:
marking the register as X_SATURATED; and
updating the current state with an X value upon the register;
(d) searching for the current state in a hash table;
(e) determining whether or not the current state was found in the hash table;
(f) if the current state was found in the hash table, setting a converged value to one;
(g) if the current state was not found in the hash table, inserting the current state into the hash table;
(h) determining whether or not one or more computational and timing resources are exceeded;
(i) if the one or more resources are not exceeded:
incrementing the time value by one; and
repeating from step (a); and
(j) if the one or more resources are exceeded:
determining whether or not the converged value is not zero;
if the converged value is zero, indicating that the netlist could not be simplified; and
if the converged value is not zero:
simplifying the netlist using information from the hash table; and
outputting the simplified netlist.

9. The system of claim 8, wherein the utility further including instructions, which when executed on the processor, provides logic for performing the functions of:
receiving design information, wherein the design information includes the netlist;
initializing the hash table;
setting the converged value to zero; and
setting the time value to an initial value.

10. The system of claim 8, wherein:
the one or more resources includes an upper bound for a number of time frames; and
said determining whether or not one or more resources are exceeded includes determining whether or not the time value exceeds the upper bound.

11. The system of claim 10, wherein the utility further including instructions, which when executed on the processor, provides logic for performing the function of:
receiving the upper bound for the number of time frames from one or more of a user, a memory, and a network.

12. The system of claim 8, wherein said initializing the hash table includes allocating space for the hash table in one or more of a memory and a disk.

13. The system of claim 8, wherein the utility further including instructions, which when executed on the processor, provides logic for performing the functions of:
receiving a X_SATURATION_TIME value;
receiving a X_SATURATION_PROPAGATE_TIME value;
determining that the time value is greater than or equal to the X_SATURATION_TIME value; and
for each register in the netlist:
determining whether or not the register is marked as X_SATURATED and the register is determined to depart from an expected prefix behavior of the register;
if the register is marked as X_SATURATED and the register is determined to depart from an expected prefix behavior of the register, determining whether or not the time value is greater than or equal to the X_SATURATION_PROPAGATE_TIME value;
if the time value is greater than or equal to the X_SATURATION_PROPAGATE_TIME value:
marking the register and fan-out registers of the register as X_SATURATED; and
updating the current state with an X value on the register and fan-out registers of the register; and
if the time value is not greater than or equal to the X_SATURATION_PROPAGATE_TIME value:
marking the register as X_SATURATED; and
updating the current state with an X value on the register.

14. A computer program product, comprising:
a computer-readable storage device; and
program instructions stored on said computer-readable storage device that when executed on a processing system, cause the processing system to perform the functions of:
(a) setting a current state;
(b) simulating, in a ternary fashion, a netlist at a time value by applying logical X values to all RANDOM gates of the netlist and to registers marked X_SATURATED of all registers of the netlist;
(c) for each register of the netlist:
determining whether or not the register is not already marked as X_SATURATED and the register is found to depart from its expected prefix behavior; and
if the register is not already marked as X_SATURATED and the register is found to depart from its expected prefix behavior:
marking the register as X_SATURATED; and
updating the current state with an X value upon the register;
(d) searching for the current state in a hash table;
(e) determining whether or not the current state was found in the hash table;
(f) if the current state was found in the hash table, setting a converged value to one;
(g) if the current state was not found in the hash table, inserting the current state into the hash table;
(h) determining whether or not one or more computational and timing resources are exceeded;
(i) if the one or more resources are not exceeded:
incrementing the time value by one; and
repeating from step (a); and
(j) if the one or more resources are exceeded:
determining whether or not the converged value is not zero;
if the converged value is zero, indicating that the netlist could not be simplified; and
if the converged value is not zero:
simplifying the netlist using information from the hash table; and
outputting the simplified netlist.

15. The computer program product of claim 14, wherein the program instructions stored on said computer-readable storage device that when executed on the processing system, cause the processing system to further perform:
receiving design information, wherein the design information includes the netlist;
initializing the hash table;
setting the converged value to zero; and
setting the time value to an initial value.

16. The computer program product of claim 14, wherein:
the one or more resources includes an upper bound for a number of time frames; and
said determining whether or not one or more resources are exceeded includes determining whether or not the time value exceeds the upper bound.

17. The computer program product of claim 16, wherein the program instructions stored on said computer-readable storage device further cause the processing system to further perform the functions of:
receiving the upper bound for the number of time frames from one or more of a user, a memory, and a network.

18. The computer program product of claim 14, wherein said initializing the hash table includes allocating space for the hash table in one or more of a memory and a disk.

19. The computer program product of claim 14, wherein the program instructions stored on said computer-readable storage device further cause the processing system to perform the functions of:
receiving a X_SATURATION_TIME value;
receiving a X_SATURATION_PROPAGATE_TIME value;
determining that the time value is greater than or equal to the X_SATURATION_TIME value; and
for each register in the netlist, performing:
determining whether or not the register is marked as X_SATURATED and the register is determined to depart from an expected prefix behavior of the register;
if the register is marked as X_SATURATED and the register is determined to depart from an expected prefix behavior of the register, determining whether or not the time value is greater than or equal to the X_SATURATION_PROPAGATE_TIME value;
if the time value is greater than or equal to the X_SATURATION_PROPAGATE_TIME value:
marking the register and fan-out registers of the register as X_SATURATED; and
updating the current state with an X value on the register and fan-out registers of the register; and
if the time value is not greater than or equal to the X_SATURATION_PROPAGATE_TIME value:
marking the register as X_SATURATED; and
updating the current state with an X value on the register.

* * * * *